(12) United States Patent
Kim et al.

(10) Patent No.: US 6,788,570 B2
(45) Date of Patent: Sep. 7, 2004

(54) MAGNETIC RANDOM ACCESS MEMORY

(75) Inventors: Chang Shuk Kim, Kyoungki-do (KR); Kye Nam Lee, Kyoungki-do (KR); In Woo Jang, Seoul (KR); Kyoung Sik Im, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/277,429

(22) Filed: Oct. 22, 2002

(65) Prior Publication Data

US 2003/0076703 A1 Apr. 24, 2003

(30) Foreign Application Priority Data

Oct. 23, 2001 (KR) ......................................... 2001-65455

(51) Int. Cl.$^7$ ............................................... G11C 11/14
(52) U.S. Cl. ....................... 365/171; 158/173; 158/175
(58) Field of Search ................................ 365/171, 158, 365/173, 175

(56) References Cited

U.S. PATENT DOCUMENTS

| | | | |
|---|---|---|---|
| 5,640,343 A | 6/1997 | Gallagher et al. | 365/171 |
| 5,793,697 A | 8/1998 | Scheuerlein | 365/230.07 |
| 5,838,608 A | * 11/1998 | Zhu et al. | 365/158 |
| 6,097,625 A | 8/2000 | Scheuerlein | 365/171 |
| 6,114,719 A | * 9/2000 | Dill et al. | 257/295 |
| 6,473,337 B1 | * 10/2002 | Tran et al. | 365/173 |

FOREIGN PATENT DOCUMENTS

| | | |
|---|---|---|
| JP | 2001-217398 | 8/2001 |
| JP | 2001-236781 | 8/2001 |
| KR | 2001-62167 | 7/2001 |

* cited by examiner

*Primary Examiner*—Richard Elms
*Assistant Examiner*—Pho M. Luu
(74) *Attorney, Agent, or Firm*—Marshall, Gerstein & Borun LLP (57) ABSTRACT

Magnetic random access memories (MRAM) are disclosed. The MRAM stores multi-level data by electronically coupling one diode and a plurality of resistance transfer devices, thereby improving a storage capacity and property of the device and achieving high integration thereof. The MRAM may also include a diode, a word line electrically coupled to the diode, a connection layer electrically coupled to the diode; and a plurality of connection pairs each comprising a resistance transfer device and a bit line electrically coupled to the resistance transfer device. One of the connection pairs may be formed on the connection layer, and the bit line of another connection pair may be perpendicular to the bit line of the first connection pair.

28 Claims, 11 Drawing Sheets

MAGNETIC RANDOM ACCESS MEMORY

FIELD OF TECHNOLOGY

The disclosed device relates to a magnetic random access memory (MRAM), and in particular, to an improved MRAM having a higher speed than static random access memory (SRAM), integration density comparable to dynamic random access memory (DRAM), and properties of nonvolatile memory such as a flash memory.

DESCRIPTION OF THE BACKGROUND ART

MRAMs using a ferromagnetic material have been developed as a next generation memory device. The MRAM is a memory device for reading and writing information by forming multi-layer ferromagnetic thin films, and sensing current variations according to a magnetization direction of the respective thin film. The MRAM has high speed, low power consumption and allows high integration density due to the special properties of the magnetic thin film, and performs nonvolatile memory operations such as a flash memory.

The MRAM is utilized as a memory device by using giant magneto-resistive (GMR) materials or a spin-polarized magneto-transmission (SPMT) generated when the spin influences electron transmission. MRAMs using GMR materials operate on the phenomenon that resistance is remarkably varied when spin directions are different in two magnetic layers having a non-magnetic layer therebetween to implement a GMR magnetic memory device. MRAMs using SPMT utilize the phenomenon that a larger current transmission is generated when spin directions are identical in two magnetic layers having an insulating layer therebetween to implement a magnetic permeable junction memory device. However, the MRAM research is still in its early stage, and mostly concentrated on the formation of multi-layer magnetic thin films. There is less concentration on researching unit cell structures and peripheral sensing circuits.

Figure 1:
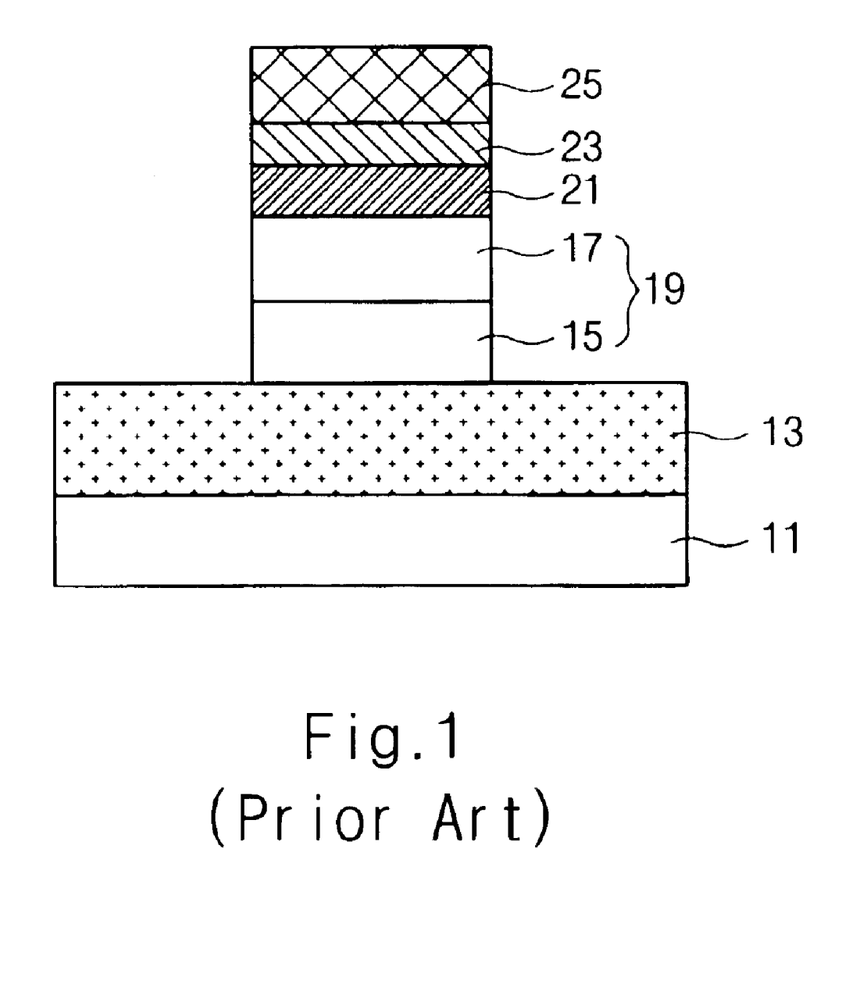
FIG. 1 is a cross-sectional diagram illustrating a first example of a conventional MRAM.
Figure 2:
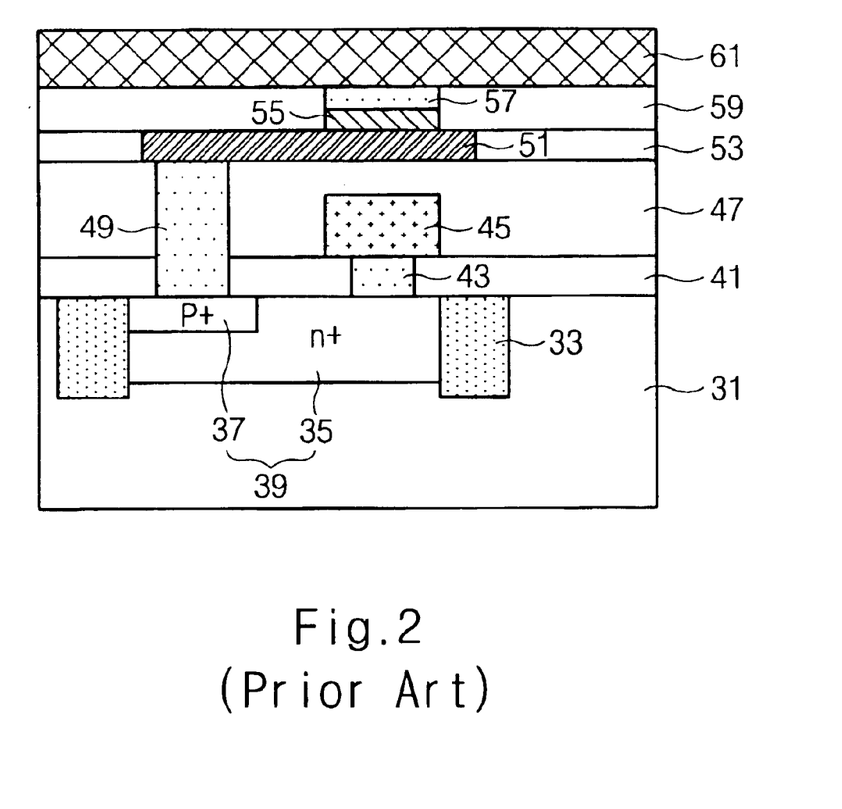
FIG. 2 is a cross-sectional diagram illustrating a second example of a conventional MRAM.
Figure 3:
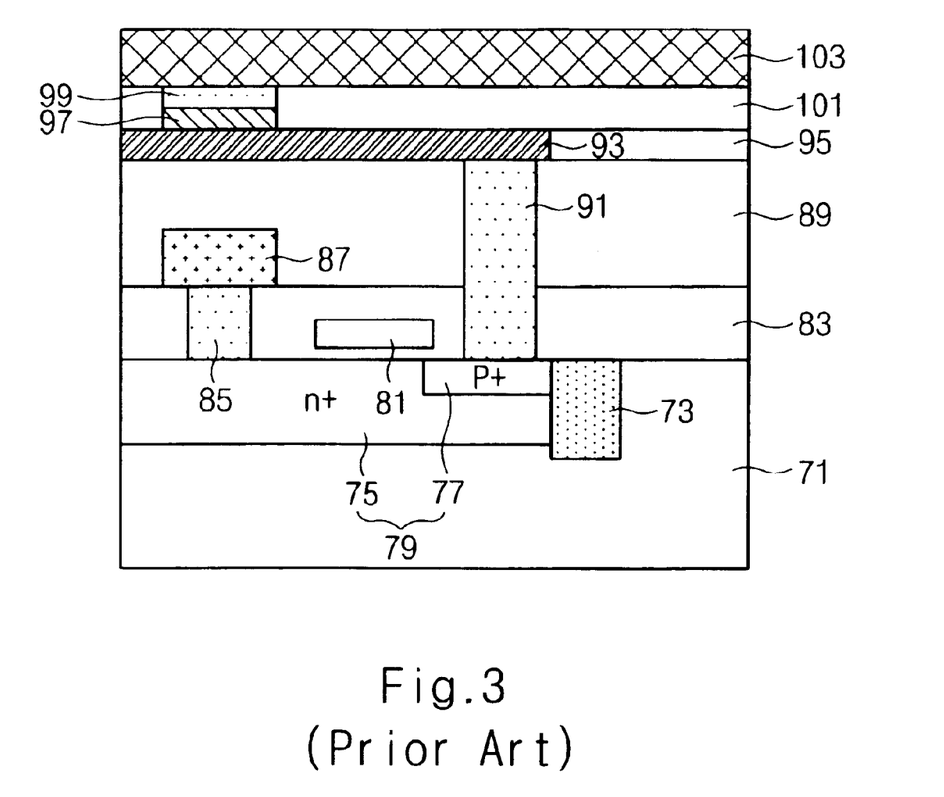
FIG. 3 is a cross-sectional diagram illustrating a third example of a conventional MRAM.

FIGS. 1 through 3 are cross-sectional diagrams illustrating respectively first, second and third examples of a conventional MRAM. In these examples, the MRAM includes one diode and one MTJ cell. FIG. 1 is a cross-sectional diagram illustrating a first example of the conventional MRAM as described in Gallagher, et al., U.S. Pat. No. 5,640,343. Referring to FIG. 1, the MRAM includes a semiconductor substrate 11 having a word line 13 formed thereon. A diode 19, having N/P type impurity layers 15 (N-type) and 17 (P-type), is provided on the word line 13. A stacked structure including a connection layer 21, a magnetic tunnel junction (MTJ) cell 23 and a bit line 25 is formed on the diode 19.

FIG. 2 is a cross-sectional diagram illustrating a second example of a conventional MRAM as described in Scheuerlein, U.S. Pat. No. 6,097,625. Referring to FIG. 2, the MRAM includes trench isolators 33 formed in a semiconductor substrate, and a diode 39. The diode 39 includes an N-type impurity layer 35 formed by implanting a highly-doped N-type impurity into the semiconductor substrate 31 between the trench isolators 33, and a P-type impurity layer 37 formed by implanting a highly-doped P-type impurity into one side of the N-type impurity layer 35. A first interlayer insulating film 41 is formed on the semiconductor substrate 31. A first contact plug 43 is connected to the N-type impurity layer 35 through the first interlayer insulating film 41. A word line 45 is connected to the first contact plug 43. A second interlayer insulating film 47 planarizes the top surface of the resultant structure. A second contact plug 49 is connected to the P-type impurity layer 37 through openings in the first and second interlayer insulating films 41, 47. A connection layer 51 contacts the second contact plug 49, and a third interlayer insulating film 53 is planarized to expose the connection layer 51. A stacked structure, including an MTJ cell 55 and a third contact plug 57, is formed above the word line 45 on the connection layer 51. A fourth interlayer insulating film 59 is planarized as high as the stacked structure, and a bit line 61 connects to the third contact plug 57. Scheuerlein '625 also mentions that the MRAM can be formed without using the third contact plug 57.

FIG. 3 is a cross-sectional diagram illustrating a third example of a conventional MRAM also described in Scheuerlein '625. Referring to FIG. 3, the MRAM includes a semiconductor substrate 71. Trench isolators 73 are formed in the semiconductor substrate 71. An N/P diode 79 having an N-type impurity layer 75 is formed by implanting a highly-doped N-type impurity into the semiconductor substrate 71 between the trench isolators 73, and a P-type impurity layer 77 is formed by implanting a highly-doped P-type impurity into one side of the N-type impurity layer 75. A gate electrode 81 is formed over the semiconductor substrate 71 and a first interlayer insulating film 83 planarizes the top surface of the resultant structure. A first contact plug 85 connects to the N-type impurity layer 75 through an opening in the first interlayer insulating film 83 and a word line 87 connects to the first contact plug 85. A second interlayer insulating film 89 planarizes the top surface of the resultant structure. A second contact plug 91 is connected to the P-type impurity layer 77 through openings in the first and second interlayer insulating films 83, 89. A connection layer 93 contacts the second contact plug 91, and a third interlayer insulating film is planarized to expose the connection layer 93. A stacked structure of an MTJ cell 97 and a third contact plug 99 is formed above the word line 87 on the connection layer 93. A fourth interlayer insulating film 101 is planarized as high as the stacked structure, and a bit line 103 is connected to the third contact plug 99.

The MRAM of FIG. 3 may also be formed without using the third contact plug 99. The addition of the gate electrode 81 improves performance of the diode and allows for higher performance sensing.

Figure 4:
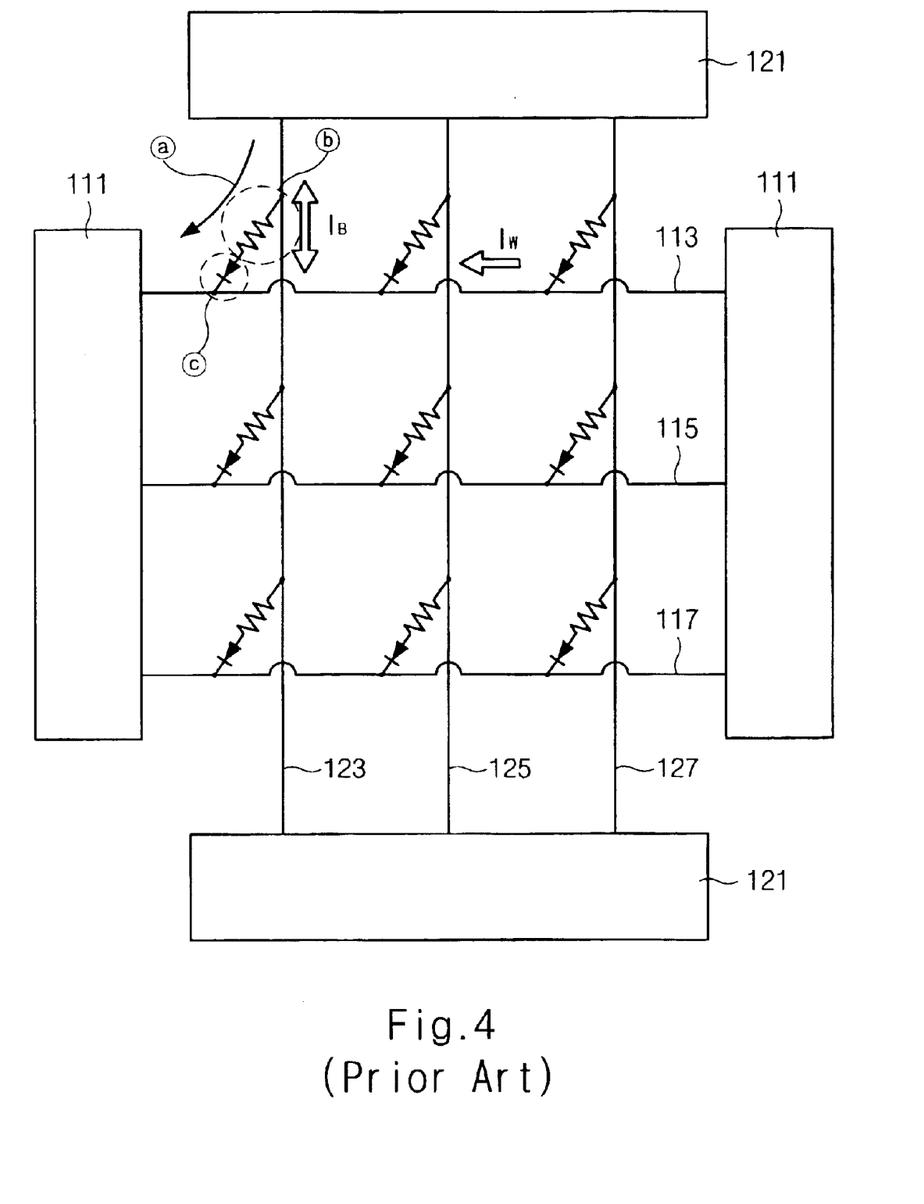
FIG. 4 is a circuit diagram illustrating the principles of operation of a conventional MRAM array.

FIG. 4 is a circuit diagram as shown in Scheuerlein, U.S. Pat. No. 5,793,697, illustrating the operational principles of an MRAM array having the structures of FIGS. 1 through 3. FIG. 4 illustrates a word line control circuit 111 attached to both ends of a first word line 113, a second word line 115 and a third word line 117. A bit line control circuit 121 is attached to both ends of a first bit line 123, a second bit line 125 and a third bit line 127 crossing the word lines 113, 115, 117. A unit cell having an MTJ cell 'b' and a PN junction diode 'c' is formed at an intersection area of the word lines 113 and the bit line 123.

A magnetic field is generated due to a current IB flowing through the bit lines 123, 125, 127 and a current IW flowing through the word lines 113, 115, 117. A write operation to a selected cell is performed by respectively passing the current IB and the current IW through the word line 113 and bit line 123 of the selected cell.

In addition, a sense current 'a' is generated due to a difference between a voltage applied to the bit line of the selected cell and a reference voltage. The sense current 'a' flows from the bit line 123 through the MTJ cell 'b' and through the resistance of the diode 'c' to the word line 113. A read operation is executed by sensing variations in the sense current 'a'.

Because the MRAM described above is formed by using one diode and one MTJ cell, thereby forming a resistance transfer device, only one bit is stored in one cell. This makes it difficult to achieve high integration density for the device.

SUMMARY

In accordance with an aspect of the invention, an MRAM is provided which includes a diode and a plurality of resistance transfer devices electrically coupled to the diode.

In accordance with another aspect of the invention, an MRAM is provided which includes a diode, a word line electrically coupled to the diode, a connection layer electrically coupled to the diode and a plurality of connection pairs. Each connection pair comprises a resistance transfer device and a bit line electrically coupled to the resistance transfer device. A first one of the plurality of connection pairs is formed on the connection layer and the bit line of a second one of the plurality of connection pairs is perpendicular to the bit line of the first one of the plurality of connection pairs.

In accordance with yet another aspect of the invention, an MRAM is provided which includes a diode, a first word line electrically coupled to the diode, a second word line electrically coupled to an external power supply, a first connection layer electrically coupled to the diode, a first resistance transfer device formed on the first connection layer above the first word line, a second resistance transfer device formed on the first connection layer above the second word line, and a bit line electrically coupled to the first and second resistance transfer devices.

In accordance with still another aspect of the invention, an MRAM is provided which includes a diode, a first word line electrically coupled to the diode, a first connection layer electrically coupled to the diode, a first resistance transfer device formed on the first connection layer above the first word line, a bist line electrically coupled to the first resistance transfer device, a second resistance transfer device formed on the bit line above the first resistance transfer device, a second connection layer electronically coupled to the first connection layer and the second resistance transfer device, and a second word line formed above the second resistance transfer device.

In accordance with a further aspect of the present invention, an MRAM is provided which includes a diode, a first word line electrically coupled to the diode, a first connection layer electrically coupled to the diode, a first resistance transfer device formed on the first connection layer above the first word line, a first bit line electrically coupled to the first resistance transfer device, a second connection layer electrically coupled to one of the first connection layer and the first bit line; a second word line formed between the second connection layer and the first bit line and above the first resistance transfer device, a second resistance transfer device formed above the second word line on the second connection layer, and a second bit line electrically coupled to the second resistance transfer device.

BRIEF DESCRIPTION OF THE DRAWINGS

Exemplary devices and methods will now be described with reference to the accompanying drawings, wherein.

DETAILED DESCRIPTION OF THE EXAMPLES

Magnetic random access memories (MRAM) will now be described with reference to FIGS. 5 through 11. In the following examples, an MTJ cell is used as the resistance transfer device. However, as will be understood by those of ordinary skill in the art, the resistance transfer device may include devices such as an anisotropic magneto-resistive (AMR), a GMR, a spin valve, a ferromagnetic material/metal semiconductor hybrid structure, a III–V group magnetic semiconductor composite structure, a metal/semiconductor composite structure, a semimetal/semiconductor composite structure or a colossal magneto-resistive (CMR).

Figure 5:
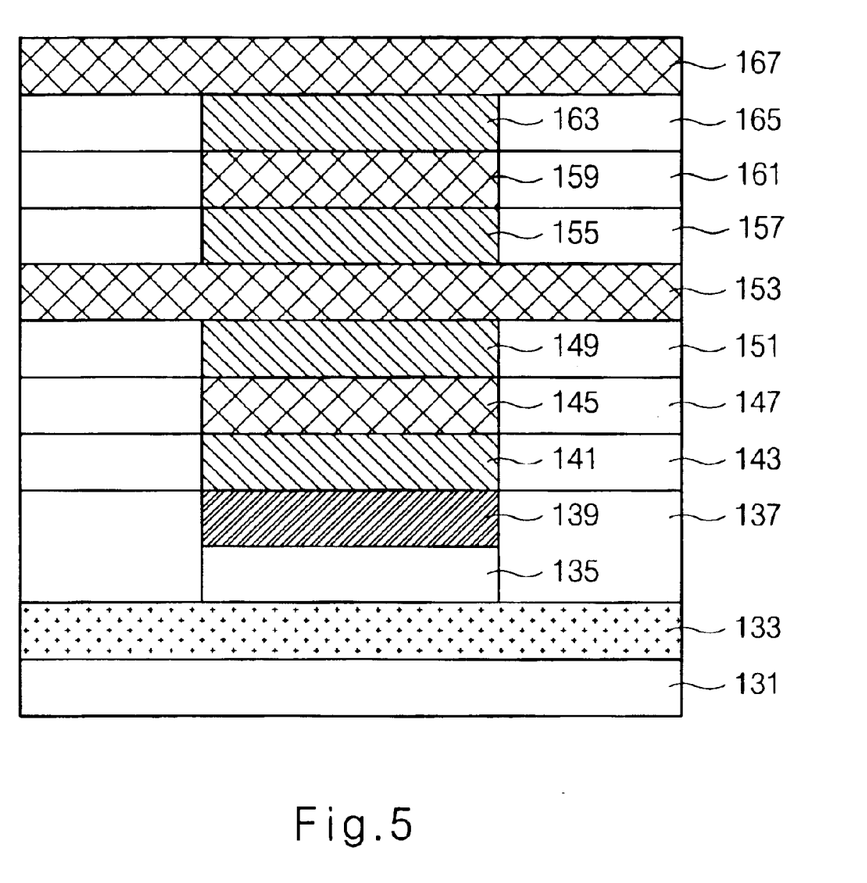
FIG. 5 is a cross-sectional diagram of a first example of an MRAM constructed in accordance with the teachings of the invention.

An exemplary MRAM is shown in FIG. 5. Referring to FIG. 5, the MRAM includes a semiconductor substrate 131 with the following structure formed thereon. A word line 133 is formed on the semiconductor substrate 131. A stacked structure comprising a diode 135 having N/P-type layers (not shown) and a connection layer 139 is formed on the word line 133. A first MTJ cell 141 is formed on the connection layer 139. A first bit line 145 is connected to the first MTJ cell 141 forming a first connection pair. A second MTJ cell 149 is formed on the first bit line 145 and a second bit line 153 is formed on the second MTJ cell 149 to create a second connection pair. The second bit line 153 extends in a direction perpendicular to the first bit line 145. A stacked structure of a third MTJ cell 155 and a third bit line 159 is formed on the second bit line 153. Another stacked structure comprising a fourth MTJ cell 163 and a fourth bit line is formed on the second bit line 153.

As shown in FIG. 5, interlayer insulating films 137, 143, 147, 151, 157, 161, 165 are included to provide insulating protection for the corresponding layers. Each interlayer insulating film may be planerized. For example, the first interlayer insulating film 137 may be planerized by using the connection layer 139 as an etch stop layer. In a similar matter, the second interlayer insulating film 143 may be planerized using the first MTJ cell 141 as an etch stop layer.

The stacked structure of the first MTJ cell 141, the first bit line 145, the second MTJ cell 149, and the second bit line 153, can be consecutively stacked. In this example, the connection layer 139 has the same width as the diode 135 and the same thickness as the first interlayer insulating film 137. The first through fourth MTJ cells 141, 149, 155, 163 are formed above one another, though not necessarily in contact with one another, so as to be vertically aligned. The first through fourth bit lines 145, 153, 159, 167 are formed on their respective MTJ cells 141, 149, 155, 163. Adjacent bit lines extend in directions perpendicular to each other (i.e., the first bit line 145 and third bit line 159 run perpendicular to the second bit line 153 and fourth bit line 167).

After the formation of each layer and the interlayer insulating films planarizing the top surfaces of each layer, each layer is exposed through an etching process and the connection layer is formed. Contact plugs (not shown) are formed so as to connect to either the upper or lower portion of the MTJ cell.

Figure 6:
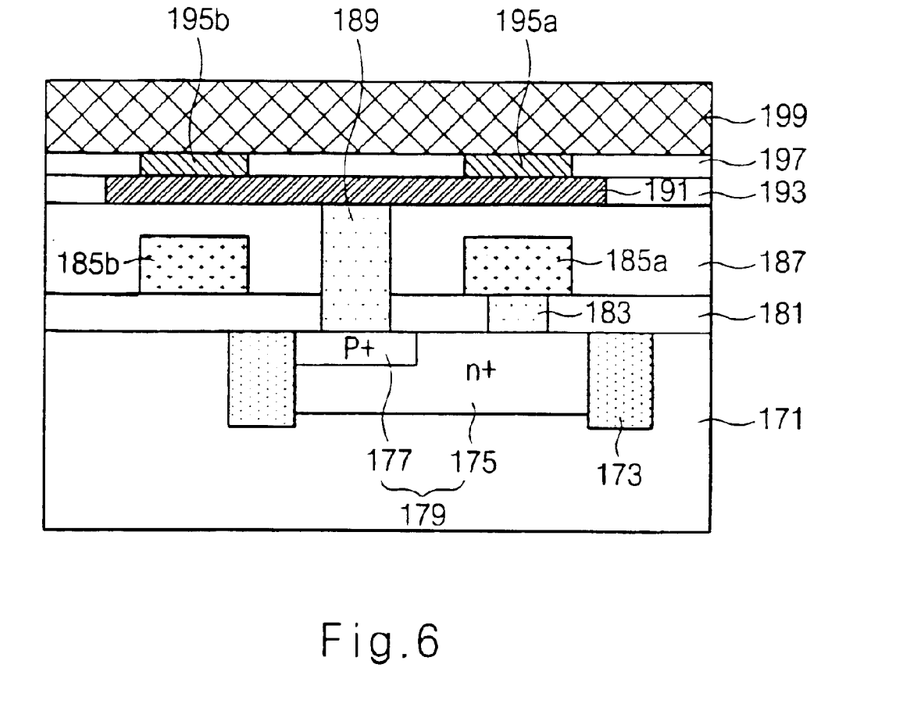
FIG. 6 is a cross-sectional diagram of a second example of an MRAM constructed in accordance with the teachings of the invention.

FIG. 6 illustrates a second example of an MRAM. In this example, first and second word lines are formed to have the same thickness, and two MTJ cells are connected in parallel to allow sensing by one bit line. As illustrated in FIG. 6, the MRAM includes a semiconductor substrate 171. Trench isolaters 173 are formed in the semiconductor substrate 171. The trench isolators 173 define an active region on the semiconductor substrate 171. An N-type impurity layer 175 is formed by implanting a highly-doped N-type impurity into the semiconductor substrate 171 between the trench isolators 173. A P-type impurity layer 177 is formed by implanting a highly-doped P-type impurity into one side of the N-type impurity layer 175, thereby forming a diode 179.

A first interlayer insulating film 181 is formed on the semiconductor substrate 171. A first contact plug 183 connects to the N-type impurity layer 175 through an opening in the first interlayer insulating film 181. A first word line 185a connects to the first contact plug 183, a the second word line 185b is simultaneously formed with the first word line 185a. The second word line is connected to a power line (not shown) connected to a separate power source. A second interlayer insulating film 187 planarizes the top surface of the resultant structure. A second contact plug 189 connects to the P-type impurity layer 177 through openings in the first and second interlayer insulating films 181, 187.

A connection layer 191 contacts the second contact plug 189. A third interlayer insulating film 193 is planarized using the connection layer 191 as an etch stop layer. A first MTJ cell 195a and a second MTJ cell 195b are formed on the connection layer 191 above the first and second word lines 185a, 185b respectively. A fourth interlayer insulating film 197 is planarized using the first and the second MTJ cell 195a and 195b as an etch stop layer. A bit line 199 connects to the first and second MTJ cells 195a, 195b.

In the example shown in FIG. 6, the second word line 185b and the first word line 185a are formed in the same process so as to have the same thickness. A third contact plug (not shown) can be formed to contact the bit line 199 at the upper portions of the first and second MTJ cells 195a, 195b. Alternatively, the third contact plug can be formed to contact the lower portions of the connection layer 191. Using the MRAM of FIG. 6, more bits can be stored in one cell by including the extra MTJ cell. In this example, additional word lines are added to correspond to the number of extra MTJ cells.

Figure 7:
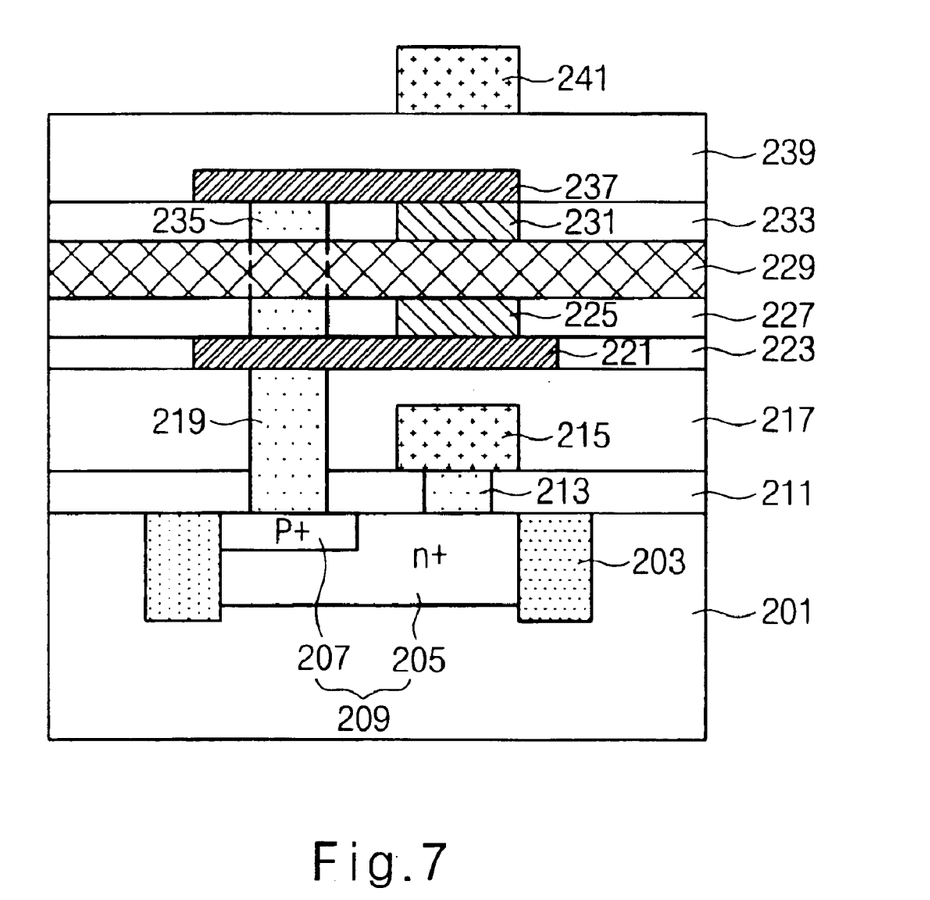
FIG. 7 is a cross-sectional diagram of a third example of an MRAM constructed in accordance with the teachings of the invention.

FIG. 7 is a cross-sectional diagram illustrating a third example of an MRAM. In this example, first and second word lines have different heights and two MTJ cells are connected in parallel to allow sensing by a single bit line. As shown in FIG. 7, the MRAM includes a semiconductor 201 having trench isolators 203, and a diode 209 having an N-type impurity layer 205 and a P-type impurity layer 207. This structure is formed in a manner similar to that of FIG. 6 and does not require further explanation.

A first interlayer insulating film 211 is formed on the semiconductor substrate 201, and a first contact plug 213 is connected to the N-type impurity layer 205 through an opening in the first interlayer insulating film 211. A first word line 215 connects to the first contact plug 213 and a second interlayer insulating film 217 planarizes the top surface of the resultant structure. A second contact plug 219 connects to the P-type impurity layer 207 through openings in the first and second interlayer insulating films 211, 217.

A first connection layer 221 contacts the second contact plug 219 and a third interlayer insulating film 223 is planarized using the first connection layer 221 as an etch stop layer. A first MTJ cell 225 is formed on the first connection layer 221 above the first word line 215. A fourth interlayer insulating film 227 is planarized using the first MTJ cell 225 as etch stop layer.

A bit line 229 is connected to the first MTJ cell 225, and a second MTJ cell is formed on the bit line 229 above the upper portion of the first MTJ cell 225. A fifth interlayer insulating film 233 is planarized using the second MTJ cell 231 as an etch stop layer. A second connection layer 237 is connected to the first connection layer 221 through a third contact plug 235 via openings in the fifth interlayer insulating film 233 and the fourth interlayer insulating film 227. The second connection layer 237 is further connected to the second MTJ cell 231. A sixth interlayer insulating film 239 planarizes the top surface of the resultant structure. A second word line 241 is formed on the sixth interlayer insulating film 239 above the second MTJ cell 231.

A separate contact plug (not shown) may be used to contact the upper or lower portions of the first and second MTJ cells. The examples of the MRAMs shown in FIGS. 6 and 7 can be combined to comprise a single MRAM. That is, referring to FIG. 6, a third MTJ cell can be formed on the bit line 199 over the first MTJ cell 195a, and a fourth MTJ cell can be formed on the bit line 199 over the second MTJ cell 195b. A fifth interlayer insulating film is planarized using the third and fourth MTJ cells as etch stop layers. A second connection layer is connected to the first connection layer 191 via a third contact plug extending through openings in the fourth and fifth intelayer insulating films. The second connection layer also connects to the third and fourth MTJ cells. A sixth interlayer insulating film planarizes the structure, and a third and fourth word lines are formed on the interlayer insulting film are over the third and fourth MTJ cells respectively.

Figure 8:
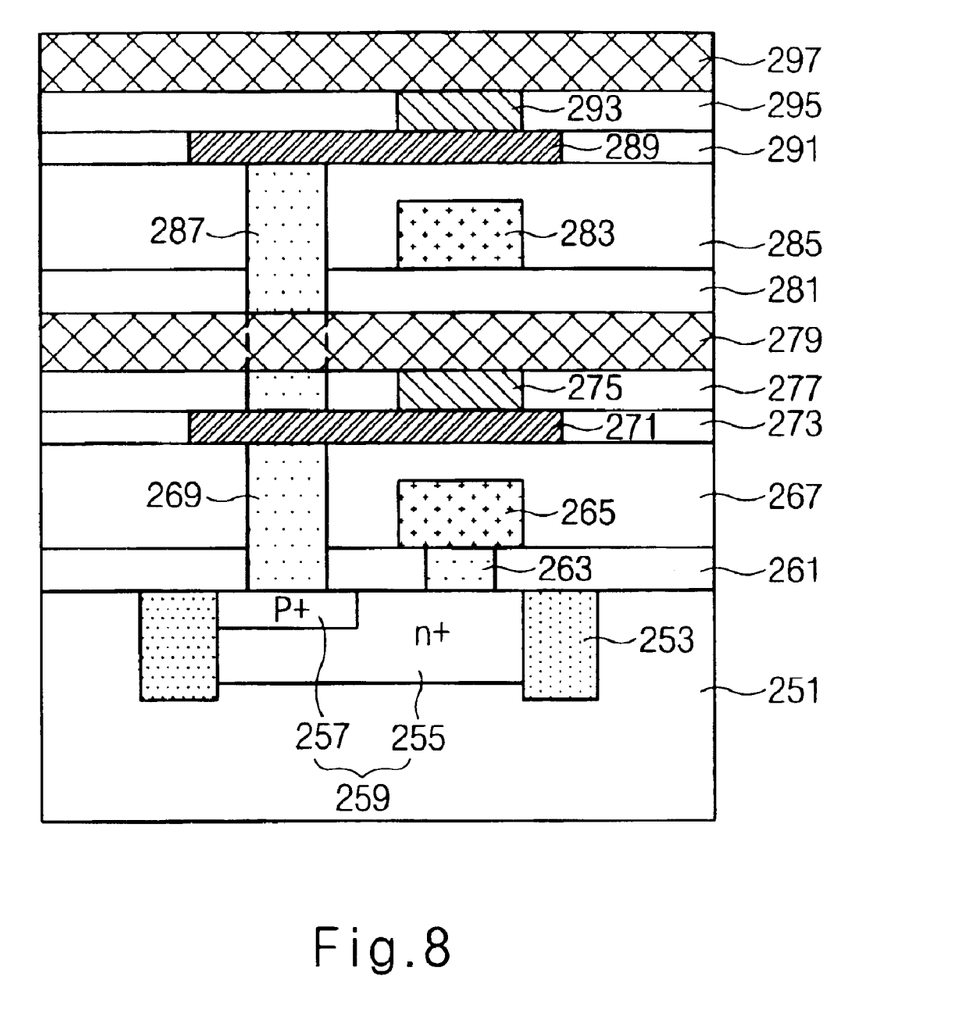
FIG. 8 is a cross-sectional diagram of a fourth example of an MRAM constructed in accordance with the teachings of the invention.

FIG. 8 is a cross-sectional diagram illustrating a fourth example of the MRAM. In this example, two MTJ cells are formed, and word lines and bit lines have different heights. Three or more MTJ cells may be provided. As in the example shown in FIG. 6 and as shown now in FIG. 8, the MRAM includes a substrate 251, trench isolators 253 and a diode 259 having an N-type impurity layer 255 an a P-type impurity 257. This base structure is formed in a manner similar to that in FIG. 6 does not require further explanation.

A first interlayer insulating film 261 is formed on the semiconductor substrate 251, and a first contact plug 263 is connected to the N-type impurity layer 255 through an opening in the first interlayer insulating film 261. A first word line 265 is connected to the first contact plug 263. A second interlayer insulating film 267 planarizes the top surface of the resultant structure. A second contact plug 269 connects to the P-type impurity layer 257 through openings in the first and second interlayer insulating films 261, 267.

A first connection layer 271 contacts the second contact plug 269, and a third interlayer insulating film 273 is planarized using the first connection layer 271 as an etch stop layer. A first MTJ cell 275 is formed on the first connection layer 271 above the first word line 265. A fourth interlayer insulating film 277 is planarized using the first MTJ cell 275 as an etch stop layer. A first bit line 279 is connected to the first MTJ cell 275.

A fifth interlayer insulating film 281 is formed on the first bit line 279, and a second word line 283 is formed on the fifth interlayer insulating film 281 above the first MTJ cell 275. A sixth interlayer insulating film 285 planarizes the resulting structure. A second connection layer 289 is connected to the first connection layer 271 through a third contact plug 287 via openings in the fifth and sixth interlayer insulating films 281, 285 and the fourth interlayer insulating film 277. A seventh interlayer insulating film 291 is planarized using the second connection layer 289 as an etch stop layer. A second MTJ cell 293 is formed on the second connection layer 289 above the second word line 283. An eighth interlayer insulating film 295 is planarized using the second MTJ cell 293 as an etch stop layer. A second bit line 297 is connected to the second MTJ cell 293.

A separate contact plug (not shown) can be used to contact the upper or lower portions of the respective MTJ cells.

Figure 9:
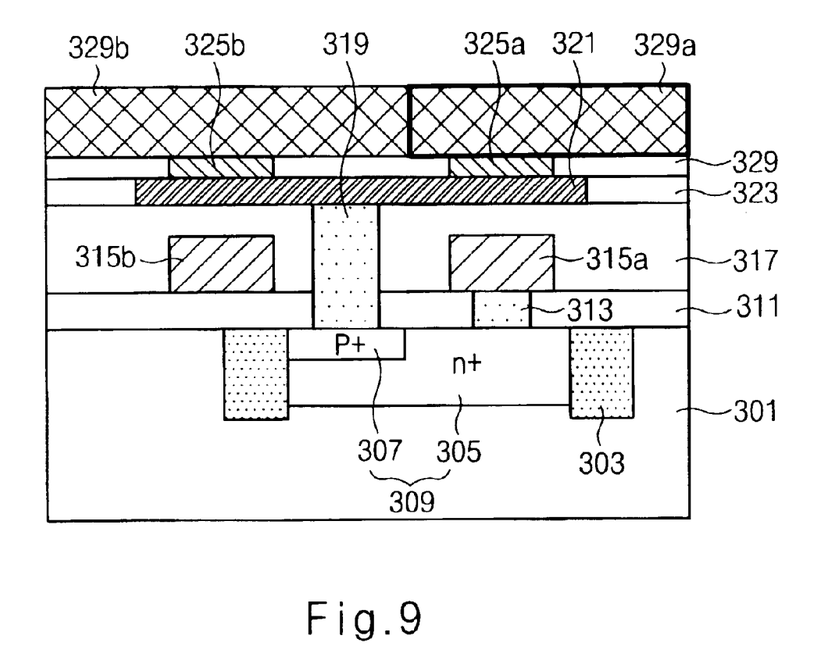
FIG. 9 is a cross-sectional diagram of a fifth example of an MRAM constructed in accordance with the teachings of the invention.

FIG. 9 is a cross-sectional diagram illustrating a fifth example of an MRAM. In this example, an MTJ cell is formed. Word lines have the same height with respect to each other as do the bit lines. As shown in FIG. 9, the MRAM includes a substrate 301, trench isolators 303, and a diode 309 having a N-type impurity layer 305 and a P-type impurity layer 307. This structure is formed in a manner similar to that in FIG. 6 and does not require further explanation.

A first interlayer insulating film 311 is formed on the semiconductor substrate 301. A first contact plug 313 is connected to the N-type impurity layer 305 through an opening in the first interlayer insulating film 311. A first word line 315a is connected to the first contact plug 313, and a second word line 315b is connected to a power line (not shown) connected to a separate power source. A second interlayer insulating film 317 planarizes the top surface of the resultant structure. A second contact plug 319 is connected to the P-type impurity layer 307 through an opening in the second interlayer insulating film 317 and the first interlayer insulating film 311.

A connection layer 321 contacts a second contact plug 319, and a third interlayer insulating film 323 is planarized using the connection layer 321 as an etch stop layer. A first MTJ cell 325a and a second MTJ cell 325b are formed on the connection layer 321 above the first and second word lines 315a, 315b respectively. A fourth interlayer insulating film 329 is planarized using the first and the second MTJ cells 325a, 325b as an etch stop layer. The MRAM of FIG. 9 further includes first and second bit lines 329a, 329b connected to the first and second MTJ cells 325a, 325b respectively. A separate contact plug may be used to contact the upper or lower portion of any MTJ cell.

Figure 10:
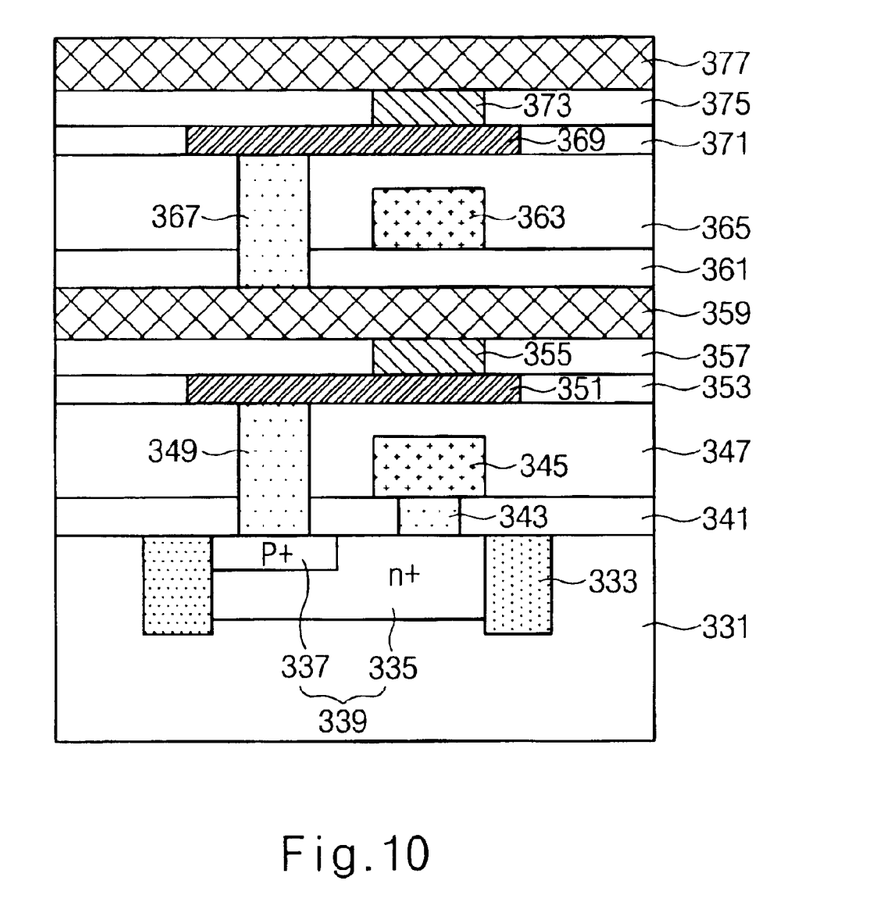
FIG. 10 is a cross-sectional diagram of a sixth example of an MRAM constructed in accordance with the teachings of the invention.

FIG. 10 is a cross-sectional diagram illustrating a sixth example of an MRAM. In this example, each of two MTJ cells is sensed by a separate bit line. The upper MTJ cell is connected to the lower bit line so that word lines and bit lines for each write line are required to perform the write operation.

As shown in FIG. 10, the MRAM includes a substrate 331, trench isolaters 333 and a diode 339 having an N-type impurity layer 335 and a P-type impurity layer 337. This structure is formed in a manner similar to that in FIG. 6 and does not require further explanation.

A first interlayer insulating film 341 is formed on the semiconductor substrate 331. A first contact plug 343 is connected to the N-type impurity layer 335 through an opening in the first interlayer insulating film 341. A first word line 345, which is a read line, is connected to the first contact plug 343, and a second interlayer insulating film 347 planarizes the top surface of the resultant structure. A second contact plug 349 is connected to the P-type impurity layer 337 through an opening in the first and second interlayer insulating films 341, 347. A first connection layer 351 contacts the second contact plug 349, and a third interlayer insulating film 353 is planarized using the first connection layer 351 as an etch stop layer. A first MTJ cell 355 is formed on the connection layer 351 above the first word line 345. A fourth interlayer insulating film 357 is planarized using the first MTJ cell 355 as an etch stop layer. A first bit line 359 is connected to the first MTJ cell 355.

A fifth interlayer insulating film 361 is formed on the first bit line 359 and a second word line 363, which is a write line, is formed on the fifth interlayer insulating film 361 above the first MTJ cell 355. A sixth interlayer insulating film 365 planarizes the resulting structure. A third contact plug 367 is connected to the first bit line 359 through openings in the fifth and sixth interlayer insulating films 361, 365. A second connection layer 369 is connected to the third contact plug 367, and a seventh interlayer insulating film 371 is planarized using the second connection layer 369 as an etch stop layer. A second MTJ cell 373 is formed on the second connection layer 369 above the second word line 363. An eighth interlayer insulating film 375 is planarized to expose the second MTJ cell 373, and a second bit line 377 is connected to the second MTJ cell 373. A separate contact plug (not shown)can be used to contact the upper or lower portion of the MTJ cell 373.

Because the resistance within the MRAM has two values depending on whether a magnetization direction of a pinned ferromagnetic layer and a free ferromagnetic layer of the MTJ cell are parallel to each other or not, four bits (00, 01, 10 and 11) can be stored in one cell when the two identical MTJ cells are employed. In addition, five bits (1*, 00*, 01*, 10* and 11*) can be stored in one cell when the two MTJ cells have different resistance values. Five bits can be stored because 0, 0* and 00* are considered the same. When three or more MTJ cells are connected in a similar fashion, more bits can be stored in one cell.

Figure 11:
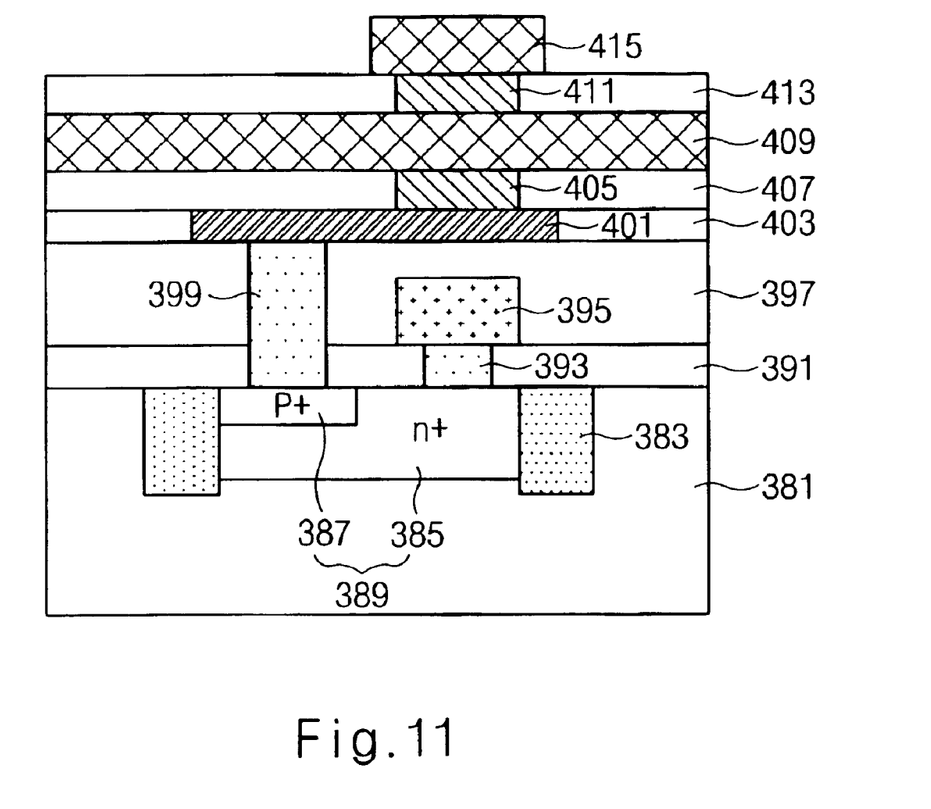
FIG. 11 is a cross-sectional diagram of a seventh example of an MRAM constructed in accordance with the teachings of the invention.

FIG. 11 is a cross-sectional diagram illustrating a seventh example of an MRAM. In this example, each of the two MTJ cells is sensed by a separate bit line. A first bit line is used as a write line for a second MTJ cell by connecting the second MTJ cell to the first bit line, instead of forming a separate write line for the second MTJ cell.

As illustrated in FIG. 11, the MRAM includes a substrate 381, trench isolators 383 and a diode 389 having an N-type impurity layer 385 and a P-type impurity layer 387. This structure is formed in a manner similar to FIG. 6 and does not require further explanation.

A first interlayer insulating film 391 is formed on the semiconductor substrate 381, and a first contact plug 393 is connected to the N-type impurity layer 385 through an opening in the first interlayer insulating film 391. A first word line 395 is connected to the first contact plug 393, and a second interlayer insulating film 397 planarizes the top surface of the resultant structure. A second contact plug 399 is connected to the P-type impurity layer 387 through openings in the first and second interlayer insulating films 391, 397.

A first connection layer 401 contacts the second contact plug 399, and a third interlayer insulating film 403 is planarized using the first connection layer 401 as an etch stop layer. A first MTJ cell 415 is formed on the connection layer 401 above the first word line 395. A fourth interlayer insulating film 407 is planarized using the first MTJ cell 405 as an etch stop layer. A first bit line 409 is connected to the first MTJ cell 405.

A second MTJ cell 411 is formed on the first bit line 409 above the first MTJ cell 405. A fifth interlayer insulating film 413 is planarized using the second MTJ cell 411 as an etch stop layer. A second bit line 405 is connected to the MTJ cell 411. A separate contact plug (not shown) can be used to contact the upper or lower portion of any MTJ cell.

In addition, more bits may be stored in one cell by respectively stacking structures comprising a third MTJ cell (not shown) and a third bit line (not shown) on the second bit line 415.

As will be recognized by those of ordinary skill in the art, the structure of the aforementioned examples can be combined to compose one MRAM.

From the foregoing, persons of ordinary skill in the art will appreciate that various MRAMs have been provided. The disclosed MRAMs are capable of storing more than two bits in one unit cell, thereby achieving high integration of the device and improving reliability of the device.

While the device has been described with respect to particular examples, it will be apparent to those of ordinary skill in the art that the scope of this patent is not limited thereto. On the contrary, this patent covers all devices and methods falling within the scope and spirit of the accompanying claims.

What is claimed is:

1. A magnetic random access memory comprising;
  a diode; and
  a plurality of resistance transfer devices, the plurality being electrically coupled in series to the diode.

2. A magnetic random access memory as defined in claim 1, further comprising a semiconductor substrate layer wherein the plurality of resistance transfer devices are aligned in a direction normal to the plane of the semiconductor substrate layer.

3. A magnetic random access memory as defined in claim 1, further comprising a semiconductor substrate wherein the plurality of resistance transfer devices are aligned parallel to the plane of semiconductor substrate layer.

4. A magnetic random access memory as defined in claim 1, wherein at least one of the resistance transfer devices is one of a magnetic tunnel junction (MTJ), an anisotropic magneto-resistive (AMR), a giant magneto-resistive (GMR), a spin valve, a ferromagnetic material/metal semiconductor hybrid structure, a III–V group magnetic semiconductor composite structure, a metal/semiconductor composite structure, a semi-metal/semiconductor composite structure and a colossal magneto-resistive (CMR).

5. A magnetic random access memory comprising:
  a diode;
  a word line electrically coupled to the diode;
  a connection layer electrically coupled to the diode; and
  a plurality of connection pairs each connection pair comprising a resistance transfer device and a bit line electrically coupled to the resistance transfer device,
  wherein a first one of the plurality of connection pairs is formed on the connection layer, and
  wherein the bit line of a second one of the plurality of connection pairs is perpendicular to the bit line of the first one of the plurality of connection pairs.

6. A magnetic random access memory as defined in claim 5, wherein the diode comprises an N-type impurity layer and a P-type impurity layer.

7. A magnetic random, access memory as defined in claim 6, wherein the P-type impurity layer formed in one side of the N-type impurity layer, and wherein the first word line is electrically coupled to the N-type impurity layer and the connection layer is electrically coupled to the P-type impurity layer.

8. A magnetic random access memory as defined in claim 5, further comprising a planarized interlayer insulating film at each layer of the diode, the connection layer, the resistance transfer devices and the bit lines.

9. A magnetic random access memory comprising:
  a diode;
  a first word line electrically coupled to the diode;
  a second word line electrically coupled to an external power supply;
  a first connection layer electrically coupled to the diode;
  a first resistance transfer device formed on the first connection layer above the first word line;
  a second resistance transfer device formed on the first connection layer above the second word line; and
  a bit line electrically coupled to the first and second resistance transfer devices.

10. A magnetic random access memory as defined in claim 9, wherein the diode comprises an N-type impurity layer and a P-type impurity layer formed in one side of the N-type impurity layer, and wherein the first word line is electrically coupled to the N-type impurity layer and the connection layer is electrically coupled to the P-type impurity layer.

11. A magnetic random access memory as defined in claim 9, further comprising at least one trench isolator defining an active region in the semiconductor substrate, wherein the diode is formed in the active region.

12. A magnetic random access memory as defined in claim 9, further comprising an insulating film between the first word line and the first connection layer.

13. A magnetic random access memory as defined in claim 9, wherein the second word line is formed substantially simultaneously with the first word line.

14. The magnetic random access memory as defined in claim 9, wherein the bit line comprises a first bit line electrically coupled to the first word line and a second bit line electrically coupled to the second word line.

15. A magnetic random access memory as defined in claim 9, further comprising:
  a third resistance transfer device formed on the bit line above the first resistance transfer device;
  a second connection layer electrically coupled to the first connection layer and the third resistance transfer devices; and
  a third word line formed above the third resistance transfer device.

16. A magnetic random access memory as defined in claim 15, further comprising:

a fourth resistance transfer device fanned on the bit line above the second resistance transfer device and electrically coupled to the second connection layer; and a fourth word line formed above the fourth resistance transfer device.

17. A magnetic random access memory as defined in claim 16, further comprising an interlayer insulating film planarizing the top surface of the second connection layer, wherein the fourth word line is formed on the interlayer insulating film.

18. A magnetic random access memory as defined in claim 15, further comprising an interlayer insulating film planarizing the top surface of the second connection layer, wherein the third word line is formed on the interlayer insulating film.

19. A magnetic random access memory comprising:

a diode;

a first word line electrically coupled to the diode;

a first connection layer electrically coupled to the diode;

a first resistance transfer device formed on the first connection layer above the first word line;

a bit line electrically coupled to the first resistance transfer device;

a second resistance transfer device formed on the bit line above the first resistance, transfer device;

a second connection layer electrically coupled to the first connection layer and the second resistance transfer device; and a second word line formed above the second resistance transfer device.

20. A magnetic random access memory as defined in claim 19, wherein the diode comprises an N-type impurity layer and a P-type impurity layer formed in one side of the N-type impurity layer, and wherein the first word line is electrically coupled to the N-type impurity layer and the connection layer is electrically coupled to the P-type impurity layer.

21. A magnetic random access memory as defined in claim 19, further comprising an interlayer insulating film planarizing the top surface of the second connection layer, wherein the second word line is formed on the interlayer insulating film.

22. A magnetic random access memory as defined in claim 19, further comprising an interlayer insulating film between the first word line and the first connection layer.

23. A magnetic random access memory comprising:

a diode;

a first word line electrically coupled to the diode;

a first connection layer electrically coupled to the diode;

a first resistance transfer device formed on the first connection layer above the first word line;

a first bit line electrically coupled to the first resistance transfer device;

a second connection layer electrically coupled to the first bit line;

a second word line formed between the second connection layer and the first bit line, and above the first resistance transfer device, a second resistance transfer device formed above the second word line on the second connection layer; and a second bit line electrically coupled to the second resistance transfer device.

24. A magnetic random access memory as defined in claim 23, wherein the diode comprises an N-type impurity layer and a P-type impurity layer formed in one side of the N-type impurity layer, and wherein the first word line is electrically coupled to the N-type impurity layer and the connection layer is electrically coupled to the P-type impurity layer.

25. A magnetic random access memory as defined in claim 23, wherein the second word line is insulated from the second connection layer and the first bit line.

26. A magnetic random access memory as defined in claim 23, wherein the first word line is a read line.

27. A magnetic random access memory as defined in claim 23, wherein the second word line is a write line.

28. A magnetic random access memory as defined in claim 23, further comprising a plurality of a stacked structure of a connection layer, a write line, a resistance transfer device and a bit line is electrically coupled to an adjacent lower connection layer stacked as a stacked structure of the second connection layer, the write line, the second resistance transfer device and the second bit line is electrically coupled to the first connection layer.

* * * * *

UNITED STATES PATENT AND TRADEMARK OFFICE
CERTIFICATE OF CORRECTION

PATENT NO. : 6,788,570 B2
DATED : September 7, 2004
INVENTOR(S) : Kim et al.

It is certified that error appears in the above-identified patent and that said Letters Patent is hereby corrected as shown below:

Column 10,
Line 13, after "A magnetic" please delete "random," and insert -- random -- in its place.

Column 11,
Line 1, after "a fourth resistance transfer device" please delete "fanned" and insert -- formed -- in its place.

Signed and Sealed this

Tenth Day of May, 2005

JON W. DUDAS
*Director of the United States Patent and Trademark Office*